United States Patent

[11] 3,617,823

[72] Inventor Steven R. Hofstein
Princeton, N.J.
[21] Appl. No. 805,237
[22] Filed Mar. 7, 1969
[45] Patented Nov. 2, 1971
[73] Assignee RCA Corporation

[54] SELF-SCANNED PHOTOTRANSISTOR ARRAY EMPLOYING COMMON SUBSTRATE
13 Claims, 4 Drawing Figs.

[52] U.S. Cl. 317/235, 340/166, 340/173, 250/211
[51] Int. Cl. H01l 11/14
[50] Field of Search 317/235 (2202), 235 (27), 235 (21.1), 235; 340/166, 173, 166 R; 250/211 J

[56] References Cited
UNITED STATES PATENTS

| | | | |
|---|---|---|---|
| 3,387,286 | 6/1968 | Dennard | 340/173 |
| 3,264,493 | 8/1966 | Price | 307/88.5 |
| 3,434,068 | 3/1969 | Sevin | 330/19 |
| 3,448,344 | 6/1969 | Schuster | 317/101 |
| 3,465,293 | 9/1969 | Weckler | 340/166 |

*Primary Examiner*—John W. Huckert
*Assistant Examiner*—Martin H. Edlow
*Attorney*—Glenn H. Bruestle

ABSTRACT: A planar phototransistor array having relatively fast response time and being efficiently sensitive to radiation in the near infrared includes a plurality of phototransistors arranged in rows and columns and conductive means which may be selectively coupled by means of an insulated gate enhancement structure to the base regions of each of the transistors. In operation, all transistors are normally biased into a nonconductive condition, but selected ones of the transistors may be biased into photoconduction and provide outputs representative of the light falling thereon.

INVENTOR
STEVEN R. HOFSTEIN
BY Robert P. Williams
ATTORNEY

INVENTOR
STEVEN R. HOFSTEIN

BY Robert P. Williams
ATTORNEY

SELF-SCANNED PHOTOTRANSISTOR ARRAY EMPLOYING COMMON SUBSTRATE

BACKGROUND OF THE INVENTION

This invention relates to an array of phototransistors adapted to translate patterns of radiation into electrical signals. More particularly, the invention pertains to such a phototransistor array adapted particularly for use in optical digital systems.

Photosensing transistor arrays are generally known. They are used in optical computer systems to translate arrays of optical information into electrical signals. Heretofore, such arrays have not had sufficiently good speed of response for many applications and have not been sufficiently sensitive to light in the near infrared portion of the spectrum to make them usable as detectors of infrared radiation such as semiconductor diode radiation.

SUMMARY OF THE INVENTION

The present phototransistor array includes a plurality of transistors having collectors formed in relatively high-resistivity semiconductive material so that a wide depletion region will exist in operation between the base and the collector of each transistor. This feature increases the collection efficiency for radiation energy near the bandgap energy of the semiconductive material. Conductive means extend adjacent to the base regions of the transistors and means are provided for selectively coupling each of the base regions to the conductive means. Conductors coupled to the emitter regions lead to the output of the device. The response speed of the device is enhanced by the coupling to the base region and by the high-resistivity material of the body.

THE DRAWINGS

THE PREFERRED EMBODIMENT

Figure 1:
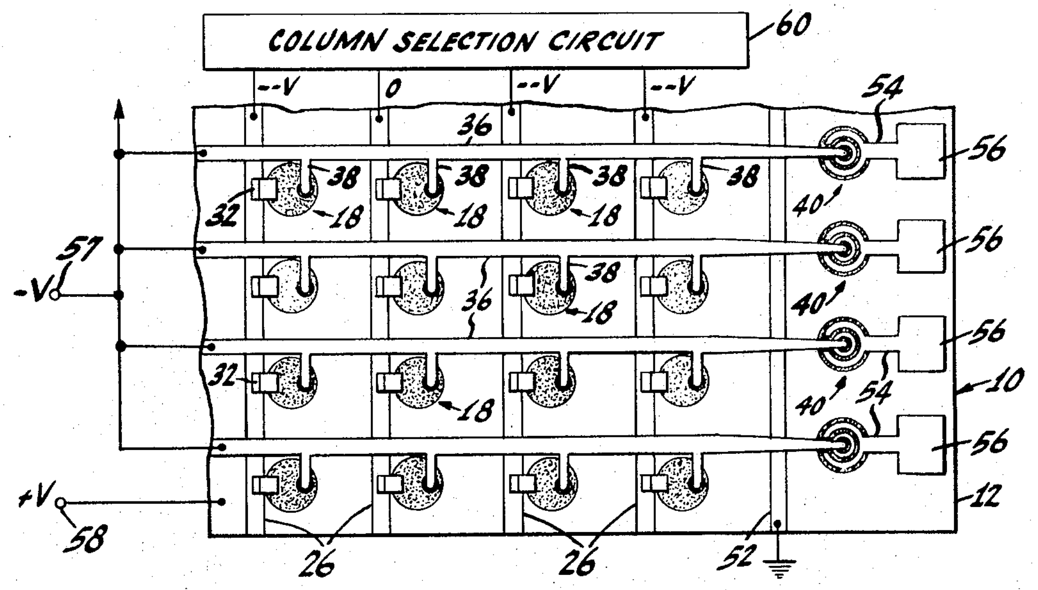
FIG. 1 is a partially schematic, partial plan view of one embodiment of the present phototransistor array.
Figure 3:
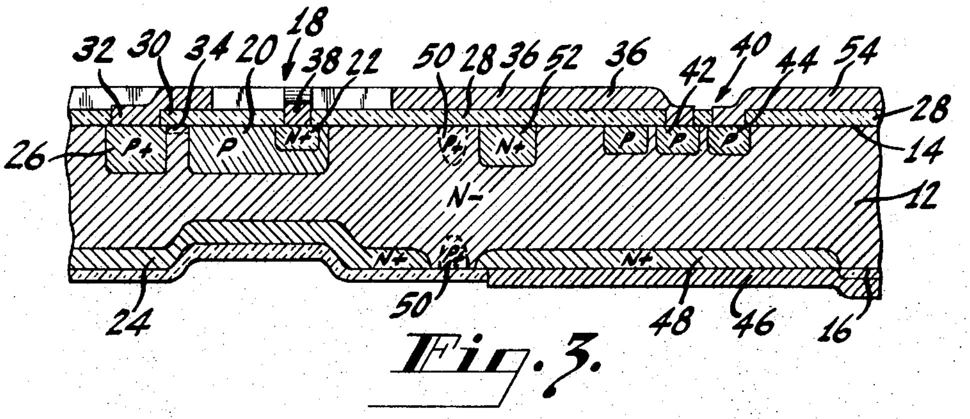
FIG. 3 is a cross section taken on the line 3—3 of FIG. 2.

The preferred embodiment of the present phototransistor array, indicated generally at 10 in FIG. 1, is formed as a monolithic integrated circuit in a body 12 of semiconductive material which has a pair of major surfaces 14 and 16, FIG. 3. Preferably, the material of the body 12 is silicon of high resistivity. In this example, the body 12 is of high-resistivity N-type material, designated N− in FIG. 3.

Diffused regions within the body 12 adjacent to the surface 14 thereof define a plurality of transistors 18 which are arranged in a plurality of rows and columns. Each of the transistors 18 includes a base region 20 of conductivity type opposite to that of said body, namely P-type, in this example. Within each of the base regions 20 is an emitter region 22 of highly doped material of conductivity type the same as that of said body, N+ in this example. The material of the body 12 constitutes a common collector region for all of the transistors 18. A diffused region 24 of relatively high-conductivity N+ material adjacent to the major surface 16 of the body 12 may be provided to establish a collector contact to the material of the body 12.

Means are provided for selectively establishing electrical connection to the base regions of all of the transistors 18 in each column selectively. For this purpose, a plurality of elongated diffused connector regions 26 are formed in the body 12 adjacent to the surface 14 thereof. The regions 26 extend parallel to the column direction adjacent to each column of transistors 18 and are spaced from the base regions 20 of the transistors 18. A coating of insulating material 28 is disposed on the surface 14 of the body 12 and has a portion 30 thereof in overlying relation to the space between each base region 20 and the regions 26. A field electrode 32 is in contact with the region 26 adjacent to each transistor 18 and extends in overlying relation to the space between the transistors and the connector regions 26. The filed electrode also overlies a portion of the base region 20 of each transistor 18. The region within the body 12 beneath the filed applying electrode 32 constitutes a channel 34 of controllable conductivity. FIG. 3.

Extending in the row direction are a plurality of metal bus bars 36. The bus bars 36 are connected to the emitter regions 22 of the transistors in each row by means of transversely extending finger 38.

Each of the bus bars 36 serves as an output line from the array 10. Preferably, a sense amplifier including a transistor 40 is included in the array to amplify the outputs of the phototransistors. In the preferred embodiment illustrated, the transistors 40 are lateral PNP structures and include diffused emitter regions 42 in the body 12 adjacent to the surface 14 and annular collector regions 44 in surrounding relation to the emitter regions 42. The material of the body 12 constitutes a common base region for the transistors 40. In contact with the opposite surface 16 of the body 12 is a base electrode 46. A diffused N+ region 48 may be provided to improve the contact of the electrode 46 to the body 12.

The region 48 and each of the other elements of each transistor 40 should be spaced far enough from the phototransistors 18 to ensure that a significantly high resistance is present between the portions of the body 12 which act as collector material for the transistors 18 and the other portions of the body 12 which act as base material for the transistors 40. If desired, P+ regions 50 may be included between the transistors 40 and the rest of the array to further increase the resistance between these portions of the body 12 by effectively narrowing the cross-sectional area of the body 12. Finally, a channel stopper region 52 should be included in the body 12 adjacent to the surface 14 in order to prevent shorting of the collector regions 44 of the transistors 40 to the base regions 20 of the transistors 18 which shorting might otherwise occur because of field effect action produced by the voltages occurring on the bus bars 36.

Figure 2:
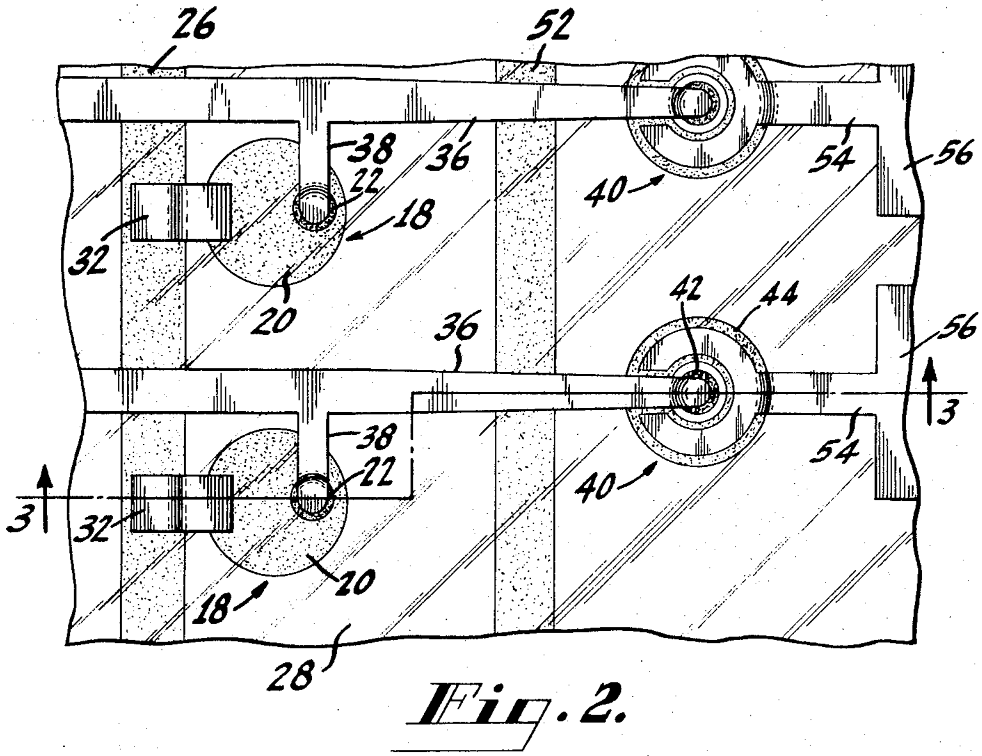
FIG. 2 is an enlarged plan view of a portion of the array shown in FIG. 1.

The outputs of the array are derived from the collectors 44 of the transistors 40. For this purpose, a collector contact 54 is connected to each collector region 44 and extends over the insulating coating 28 to suitable bonding pads 56 adjacent to the right side of the array as seen in FIGS. 1 and 2.

In the utilization of the array 10, the row bus bars 36 are connected through suitable external circuitry, indicated at the left side of FIG. 1, to a source of potential represented by the terminal 57. The common collector material of the body 12 is connected through the N+ region 24 adjacent to the surface 16 of the body 12 to another source of potential represented by the terminal 58 in FIG. 1. The column connector regions 26 are connected to an external column selection circuit 60 as shown in block diagram form at the top of FIG. 1.

Figure 4:
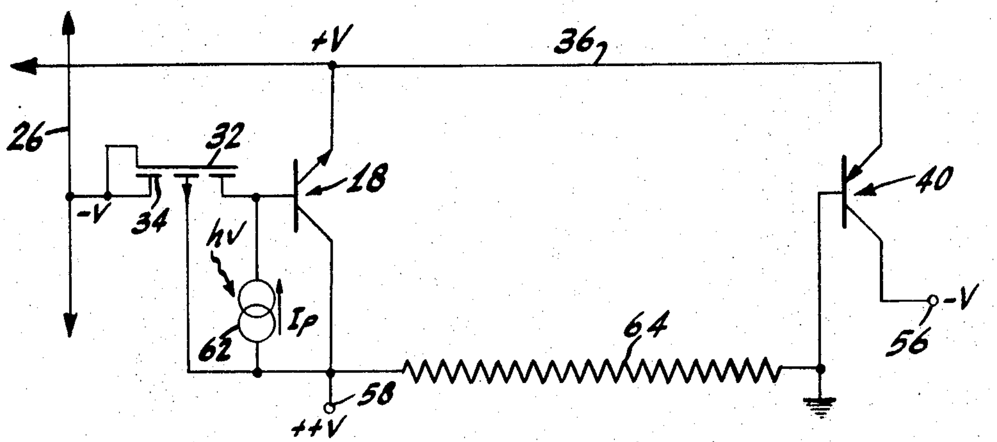
FIG. 4 is a schematic representation of the equivalent circuit of the structure appearing in FIG. 3.

The operation of each element of the array will be best understood from a consideration of the circuit diagram of FIG. 4. In FIG. 4, a transistor 18 is represented schematically as being connected between a lead 36 and the +V terminal 58. The base of the transistor 18 is shown as connected to the column connector 26 through an enhancement-type field effect transistor having a gate 32 and a channel 34, connected as a diode. The sensitivity of the transistor 18 to radiation is represented in FIG. 4 by a current source 62 connected in the base circuit of the transistor 18. The output sense transistor 40 is also represented in FIG. 4 with its emitter connected to the transistor 18 through the lead 36, its base connected to ground and to the collector of the transistor 18 through the large resistance 64, which is in fact the resistance of the material of the body 12 between the transistor 40 and the transistor 18 in the actual structure. The collector of the transistor 40 is connected to the output terminal 56.

The column selection circuit 60 serves to apply a bias to the column connector lines 26 which is negative with respect to the other voltages applied to the other terminals. As the drawings are labeled the terminal 57, and thus all of the emitter leads 36, is biased at a negative potential indicated by the symbol —V. The common collector region of the transistors 18 biased at a potential which is positive with respect to ground as indicated by the symbol +V. The voltages applied to the connector bars by the column selection circuit 60 are indicated as negative with respect to the negative voltage applied to the terminal 26 by means of the symbol —V.

A potential on the lead 26 which is negative with respect to the potential on the emitter of the transistor 18 will bias the channels 34 associated with each transistor 18 into a conductive state. This effectively places the base regions 20 of the transistors 18 at the potential on the lead 26. Since this potential is negative with respect to the potential existing on the leads 36, and thus on the emitter of the transistor 18, the emitter-base junction of the transistor 18 will be reverse biased and likewise the base-collector junction will be reverse biased and the transistor will not operate. Thus, assuming that a —V voltage is applied to all of the lines 26, no output will be derived from the array. Each column of the array, as illustrated in FIG. 1, may represent a word of digital information and each transistor within each column would then represent a bit of information. The information would be in the form of a pattern of radiation in which, for example, a state of illumination on a given transistor would represent a "1" and a lack of illumination would represent a "0." If it is desired to read out the information on a particular word, then the connector region 26 associated with that word column is brought to "0" volts by the column selection circuit 60. In the example illustrated in FIG. 1, the second region 26 from the left is represented as being in this state. Existence of "0" volts on the lead 26 acts to remove the negative bias from the base regions 20 of all of the transistors 18 in that particular column because the relatively positive voltage on each field electrode 32 causes the conductive channel region 34 associated therewith to be in its nonconductive state. Consequently, the base region 20 of each transistor in the selected column will be isolated.

In the transistors in the isolated column, base photocurrent, indicated by the symbol $I_p$ in FIG. 4, will flow and consequently, through transistor action, emitter current equal to $\beta I_p$ will flow. The emitter current is sensed by the output transistors 40 and will appear in the output of the device on the terminals 56. In those transistors which are not illuminated, photocurrent will be less than in those which are illuminated. Thus, an electrical representation of the information on the selected column will be available at the output.

The speed of operation of the present device is a function of the time required to change the base-emitter junction of each transistor from its normally reverse-biased condition into a forward-biased condition. This time is given by the formula $$T_R = \frac{\Delta V_{be}(C_{bc}+C_{be})}{I_p}$$

where $\Delta V_{be}$ is the required voltage difference from base to emitter to achieve injection; $C_{be}$ is the base-to-emitter capacitance; $C_{bc}$ is the base to collector capacitance and $I_p$ is the photocurrent which flows when the base is isolated. The response time in the present device is optimized by several factors. One factor is the high-resistivity collector material of each transistor 18, that is, the material of the body 12. This high resistivity results in a relatively deep depletion region at each base-collector junction which effectively reduces $C_{bc}$ and greatly increases $I_p$. Another factor is the relatively small emitter area which reduces $C_{be}$. Some optimization of the response time also results from the condition of overlap between the field electrode 32 at each transistor 18 and the base region 20 thereof. The dynamic transient change in voltage when a connector 26 is brought from —V to 0 is capacitively coupled through this gate overlap to the base region. This transient can force the base into forward conduction, where it will be maintained if photocurrent is present. In other words, the condition of overlap and the application of a pulsed voltage by capacitive coupling effectively reduces the value of $\Delta V_{be}$ which the photocurrent must supply.

The wide depletion region associated with the base-collector junctions of the transistors 18 in the present device also increases the sensitivity of the device. It is this wide depletion region which increases the collection efficiency of the device for radiation near the bandgap energy of the silicon. Such energy is in the near infrared, which makes the present device particularly useful as a detector of gallium arsenide laser radiation.

I claim:

1. A photosensitive transistor array comprising:
- a body of photosensitive semiconductive material having a surface, said body being of one type conductivity,
- means defining a plurality of transistors in said body, said means comprising a plurality of first regions of conductivity type opposite to that of said body in said body adjacent to said surface and a second region of said one type conductivity within each of said first regions, the material of said body constituting a common region for all of said transistors,
- first conductive means extending adjacent to said first regions,
- channel means of controllable conductivity in said body adjacent to said surface and extending between each of said first regions and said first conductive means,
- a coating of insulating material on said surface over each channel means,
- a metal field electrode on said insulating coating over each channel means and contacting said first conductive means, and
- second conductive means coupled only to said second regions.

2. A photosensitive transistor array as defined in claim 1 wherein said first conductive means comprises diffused regions of conductivity type opposite to that of said body in said body adjacent to said first region.

3. A photosensitive transistor array as defined in claim 2 wherein each insulating coating and each field electrode extend in overlapping relation to each first region.

4. A photosensitive transistor array as defined in claim 2 wherein said transistors are arranged in a two-dimensional matrix and wherein said first conductive means extend parallel to one direction of said matrix and said second conductive means comprises a plurality of metal bars extending parallel to the other direction of said matrix.

5. A photosensitive transistor array comprising a body of semiconductive material having a surface, said body being of relatively low conductivity of one type,
- means defining a plurality of phototransistors in said body, said means comprising a plurality of base regions of conductivity type opposite to that of said body in said body adjacent to said surface and an emitter region within each said base region and defining an emitter-base junction therewith, the material of said body constituting a common collector region for all of said phototransistors,
- means for normally applying to said base regions a voltage having a polarity and magnitude sufficient to maintain said emitter-base junctions in reverse-biased condition and for selectively removing the reverse-biasing voltage from at least one of said phototransistors whereby the base region of said one phototransistor is effectively isolated, and
- means coupled to said phototransistors for deriving outputs which are functions of the photocurrent flowing in each selected transistor.

6. A photosensitive transistor array as defined in claim 5 wherein said phototransistors are arranged in a plurality of rows and columns,
- said means for removing reverse bias being adapted to be coupled to all the transistors in a selected column and including a plurality of column connector regions of low resistivity of conductivity type opposite to that of said body in said body adjacent to said surface, each of said column connector regions extending parallel to and spaced from the base regions of the transistors in one of said columns, a coating of insulating material on said surface over the space between the column connector regions and said base regions, and a plurality of metal electrodes, each of which is in contact with a column connector region and extends over said insulating coating in field applying relation to the space between said column connector region and said base region.

7. A photosensitive transistor array as defined in claim 5 wherein said insulating coating and each of said metal electrodes extends in overlying relation to a base region.

8. A photosensitive transistor array as defined in claim 5 wherein said means for deriving outputs comprises a plurality of transistors formed in said body, each of said transistors being electrically coupled to an emitter region of one of said phototransistors.

9. A photosensitive transistor array comprising a body of monocrystalline silicon having a pair of opposed major surfaces, said body being of relatively low conductivity of one type, means in said body defining a plurality of phototransistors arranged in rows and columns, said means comprising a plurality of base regions of conductivity type opposite to that of said body in said body adjacent to one of said major surfaces and an emitter region within each said base region and defining an emitter-base junction therewith, the material of said body constituting a common collector region for all of said phototransistors, a plurality of elongated diffused connector regions of low resistivity of conductivity type opposite to that of said body in said body adjacent to said one major surface, each of said connector regions extending parallel to and spaced from the base regions of the transistors in one of said columns, a coating of insulating material on said surface over the space between said connector regions and said base regions, a plurality of metal electrodes, each of which is in contact with a connector region and extends over said insulating coating in field applying relation to the space between said connector region and said base region, and a plurality of conductive bars on said insulating coating and extending in the row direction parallel to each row of said phototransistors, said bars each being coupled to the emitter regions of the transistors in a row.

10. A photosensitive transistor array as defined in claim 9 further comprising means for making contact to the common collector region of said transistors, said means comprising a diffused region of low resistivity of the same type as said body in said body adjacent to the other of said major surfaces.

11. A photosensitive transistor array as defined in claim 10 further comprising a plurality of sense transistors in said body, each of said sense transistors comprising a diffused emitter region of conductivity type opposite to that of said body in said body adjacent to said one surface thereof, and an annular diffused collector region of conductivity type opposite to that of said body in surrounding relation to each of said emitter regions, said material of said body constituting a common base region for all of said sense transistors.

12. A photosensitive transistor array as defined in claim 11 wherein said sense transistors are spaced from said phototransistors by a distance sufficiently great to produce a substantial resistance between the base material of said sense transistors and the collector material of said phototransistors.

13. A photosensitive transistor array as defined in claim 12 further comprising elongated diffused regions of low-resistivity material of conductivity type opposite to that of said body in said body in the space between said sense transistors and the balance of said array, said diffused regions serving to increase the resistance between the base regions of said sense transistors and the balance of the array.

* * * * *